(12) United States Patent
Ahner et al.

(10) Patent No.: US 9,792,945 B1
(45) Date of Patent: Oct. 17, 2017

(54) 3D OPTICAL MEMORY STORAGE CELLS

(71) Applicant: Seagate Technology LLC, Cupertino, CA (US)

(72) Inventors: Joachim Ahner, Livermore, CA (US); David Marcus Tung, Livermore, CA (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 15/345,389

(22) Filed: Nov. 7, 2016

(51) Int. Cl.
| | |
|---|---|
| *G11B 11/00* | (2006.01) |
| *G11C 13/04* | (2006.01) |
| *G11C 11/00* | (2006.01) |
| *G11B 7/00* | (2006.01) |
| *G11B 7/1275* | (2012.01) |

(52) U.S. Cl.
CPC .............. *G11B 11/00* (2013.01); *G11C 11/00* (2013.01); *G11C 13/047* (2013.01); *G11C 13/048* (2013.01); *G11B 7/1275* (2013.01); *G11B 11/002* (2013.01); *G11B 2007/0009* (2013.01); *G11C 13/041* (2013.01)

(58) Field of Classification Search
CPC ..... G11C 13/047; G11C 11/00; G11C 13/048; G11C 13/041; G11B 11/00; G11B 7/1275; G11B 11/002; G11B 2007/0009
See application file for complete search history.

(56) References Cited

U.S. PATENT DOCUMENTS

| 4,471,470 A * | 9/1984 | Swainson | B82Y 10/00 359/244 |
|---|---|---|---|
| 5,253,198 A * | 10/1993 | Birge | G11C 13/045 365/106 |
| 6,970,414 B1 * | 11/2005 | Pavel | B82Y 10/00 369/100 |
| 2007/0047287 A1 * | 3/2007 | Hell | B82Y 10/00 365/129 |
| 2011/0019511 A1 * | 1/2011 | Fort | B82Y 10/00 369/13.14 |

* cited by examiner

*Primary Examiner* — Harry W Byrne
*Assistant Examiner* — Ajay Ojha

(57) ABSTRACT

An apparatus includes a first storage cell with an electrical property. The first storage cell is configured to change the electrical property in response to a first light energy, and to maintain the change to the electrical property. The first storage cell is also configured to alter the change to the electrical property in response to a second light energy, and to maintain the alteration to the change to the electrical property. A second storage cell disposed over the first storage cell in a vertical plane of the first storage cell. A third storage cell disposed adjacent to the first storage cell in a horizontal plane of the first storage cell.

18 Claims, 11 Drawing Sheets

3D OPTICAL MEMORY STORAGE CELLS

BACKGROUND

Certain devices use disk drives with perpendicular magnetic recording media to store information. For example, disk drives can be found in many desktop computers, laptop computers, and data centers. Perpendicular magnetic recording media store information magnetically as bits. Bits store information by holding and maintaining a magnetization that is adjusted by a disk drive head. In order to store more information on a disk, bits are made smaller and packed closer together, thereby increasing the density of the bits. Therefore as the bit density increases, disk drives can store more information. However as bits become smaller and are packed closer together, the bits become increasingly susceptible to erasure, for example due to thermally activated magnetization reversal or adjacent track interference.

SUMMARY

Provided herein is an apparatus including a first storage cell with an electrical property. The first storage cell is configured to change the electrical property in response to a first light energy, and to maintain the change to the electrical property. The first storage cell is also configured to alter the change to the electrical property in response to a second light energy, and to maintain the alteration to the change to the electrical property. A second storage cell disposed over the first storage cell in a vertical plane of the first storage cell. A third storage cell disposed adjacent to the first storage cell in a horizontal plane of the first storage cell. These and other features and advantages will be apparent from a reading of the following detailed description.

DESCRIPTION

Figure 1:
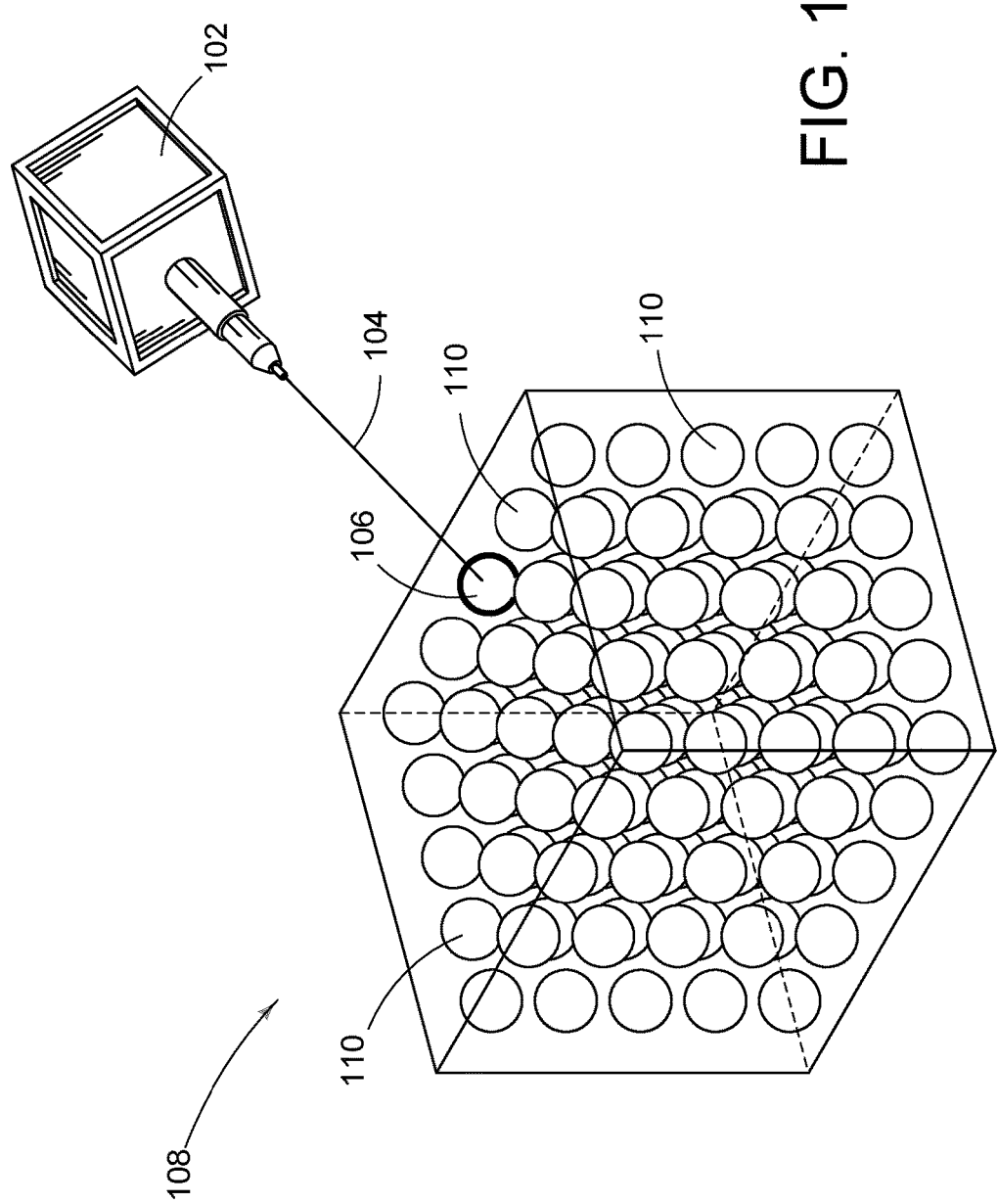
FIG. 1 shows an emitter focusing a laser on a target cell of a three dimensional storage device according to one aspect of the present embodiments.

Before various embodiments are described in greater detail, it should be understood that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood that the terminology used herein is for the purpose of describing the certain concepts, and the terminology is not intended to be limiting. Unless defined otherwise, all technical and scientific terms used herein have the same meaning as commonly understood in the art to which the embodiments pertain.

Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "middle," "bottom," "beside," "forward," "reverse," "overlying," "underlying," "up," "down," or other similar terms such as "upper," "lower," "above," "below," "under," "between," "over," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

As the technology of magnetic recording media reaches maturity, it becomes increasingly difficult to continue to increase the storage capacity of recording media (e.g. disk drive disks) or to reduce the size of recording media while maintaining storage capacity. Such challenges may be overcome by increasing the bit density on the recording media. However, increasing the bit density is not always possible. For example, increasing bit density can decrease the signal to noise ratio ("SNR") below acceptable levels. Furthermore, reducing the bit size or the thickness of the stack lowers the thermal stability of the grains within the bits, thereby increasing the grains' susceptibility to fluctuation and information loss.

Embodiments described below address these concerns with information storage cells arranged in a three dimensional structure where information is stored electrically with the use of one or more lasers. For example, in various embodiments a higher power write laser is used to write information to a storage cell by electrically changing electrical orientations and intensities of the storage cell. A lower power read laser is used to read the stored information from the storage cell, without altering the electrical orientations and intensities (e.g. changing the stored information) of the storage cell. The read/write lasers may be focused at any depth and location within the three dimensional structure, without being interfered with or interfering with other storage cells.

Referring now to FIG. 1, an emitter 102 focusing a laser 104 on a target cell 106 of a three dimensional storage device 108 are shown according to one aspect of the present embodiments. The emitter 102 may be for example a femtosecond laser that emits light energy as the laser 104. The laser 104 is focused on the target cell 106. The target cell 106 is one of many storage cells 110 arranged within a three dimensional array within the three dimensional storage device 108. When the laser 104 is focused on the target cell 106, properties of the target cell 106 are altered, thereby storing information. For example, the laser 104 may change properties of the target cell 106 including electrical orientations and intensities. Therefore, as a result of altering the properties, information may be written to the cells.

The emitter 102 is configured to alter the electrical orientations and intensities of the target cell 106 by focusing the laser 104 directly on the target cell 106. As such, the laser 104 does not affect other storage cells 110 until the laser 104 is focused on another storage cell. The laser 104 may be focused at any location and depth within the three dimensional storage device 108. For example, the emitter 102 may focus the laser 104 at a location directly in the middle of the three dimensional storage device 108. As a result, the laser 104 will pass through many of the storage cells 110, without affecting their electrical characteristics (e.g. electrical orientations and intensities). However, the storage cell directly in the middle that the laser 104 is focused upon will have its electrical characteristics changed as a result of the focused laser 104. In various embodiments, the storage cells 110 retain their electrical characteristics after the writing process performed by the emitter 102 and the laser 104.

It is understood that in various embodiments the illustrated storage cells 110 are figurative representations of locations within the three dimensional storage device 108. Therefore, in some embodiments two similarly shaped and sized three dimensional storage devices may have different densities and/or patterns of storage cells as a result of varying the focused locations of the laser 104.

In various embodiments, the three dimensional storage device 108 is a transparent or semi-transparent material. For example, the three dimensional storage device 108 may include quartz, diamond, aluminum oxide, or other transparent/semi-transparent materials. In some embodiments, the laser 104 may create little to no heat within the three dimensional storage device 108. It is understood that heat may be prevented, for example, by selecting an emitter 102 which produces a laser 104 that does not cause the molecules of the three dimensional storage device 108 to vibrate in a heat producing fashion. For example, a femtosecond laser may be focused on the target cell 106, without heating the target cell 106, other storage cells 110, and other areas of the three dimensional storage device 108. Such examples for preventing or limiting heat are merely exemplary and are understood to be non-limiting.

Figure 2:
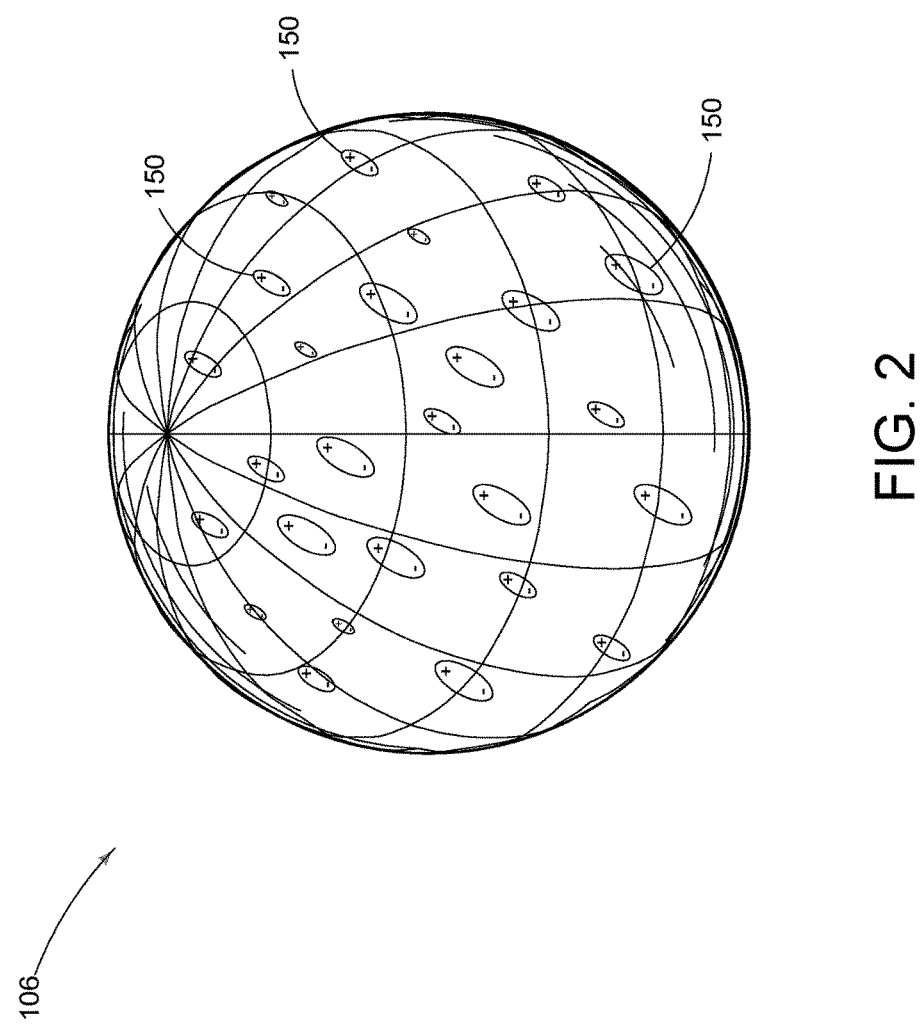
FIG. 2 shows an enlarged view of the target cell including figurative representations of dipole orientations according to one aspect of the present embodiments

Referring now to FIG. 2, an enlarged view of the target cell 106 including figurative representations of dipole orientations 150 is shown according to one aspect of the present embodiments. In some embodiments, the laser 104 (see FIG. 1) causes mobility within the target cell 106 such that the dipole orientations 150 within the target cell 106 align with the excitation laser. In other embodiments, a separate orientation laser may be used to cause alignment of the dipole orientations 150. The dipole orientations 150 may be aligned in any direction. For example, in the illustrated embodiment the dipole orientations 150 may be identified according to a spherical coordinate system. However, alternate embodiments may use coordinate systems and alignments according to any shape. As a result of the dipole orientations 150, the target cell 106 may store information according to both the target cell's location within the three dimensional storage device, as well as the target cell's dipole orientation.

Figure 3:
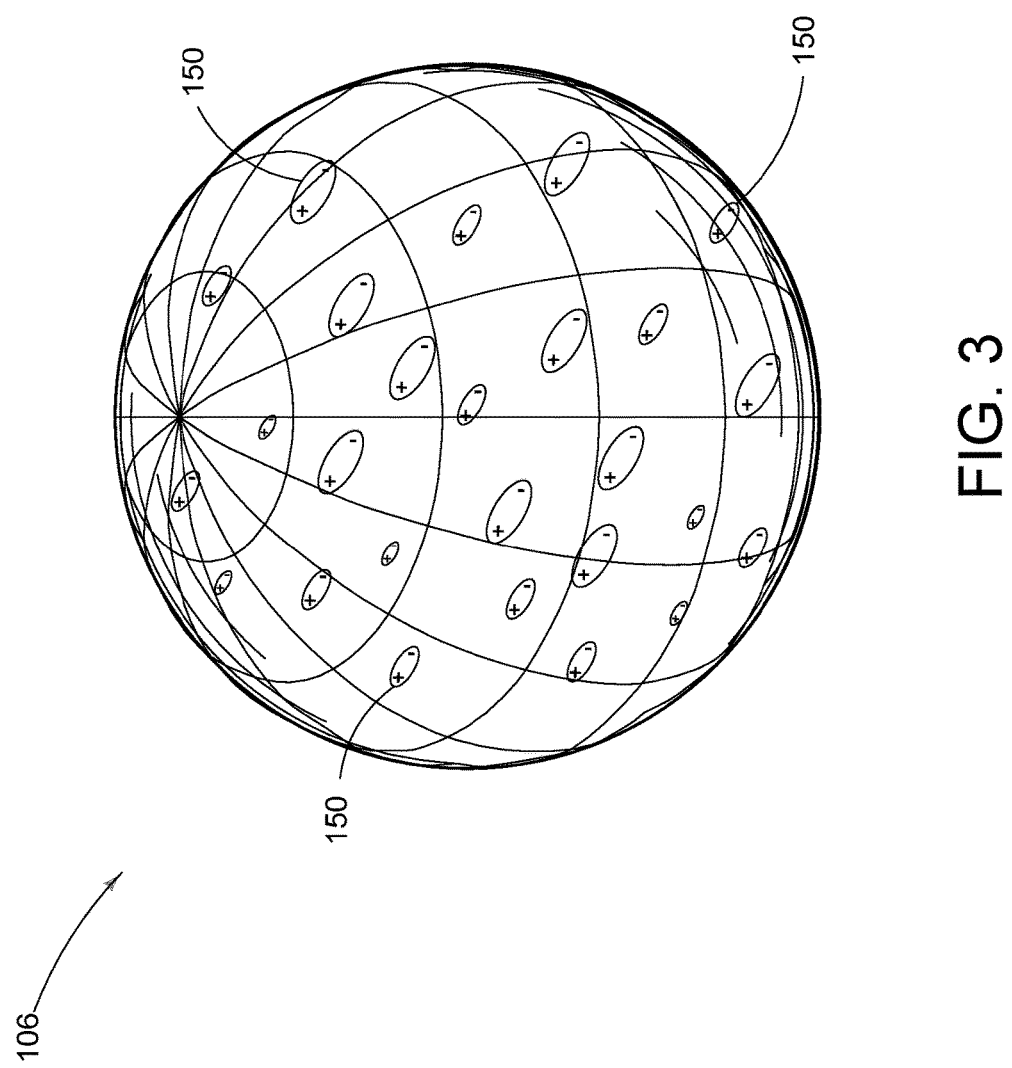
FIG. 3 shows an enlarged view of the target cell including changes to the figurative representations of the dipole orientations according to one aspect of the present embodiments.

Referring now to FIG. 3, an enlarged view of the target cell 106 including changes to the figurative representations of the dipole orientations 150 is shown according to one aspect of the present embodiments. As described above, dipole orientations 150 may be aligned and realigned over and over again. For example, one or more lasers may cause mobility of the dipole orientations 150 allowing for alignment/realignment of the dipole orientations 150 in order to store information. Furthermore, different laser characteristics may be used to alter the dipole orientations 150 in predetermined fashions. For example, a first light energy may change the dipole orientations 150 (e.g. electrical properties) in a first desired way. A second light energy that is different from the first light energy (e.g. different intensity, wavelength, etc.) may alter the previous change to the dipole orientations 150 in a second desired way. As a result, the target cell 106 (e.g. information storage cell) may be repeatedly written and rewritten according to variations in the light energy.

It is understood that in various embodiments not all of the dipole orientations 150 will share the same alignment, and it is not necessary for all of the dipole orientations 150 to share the same alignment. In such embodiments, information can be stored by orienting enough of the dipole orientations 150 for an alignment to be determined. Indeed, in other embodiments more than one alignment can be shared by different groups within the target cell 106, as long as the different alignments are detectable enough to retrieve stored information.

Figure 4:
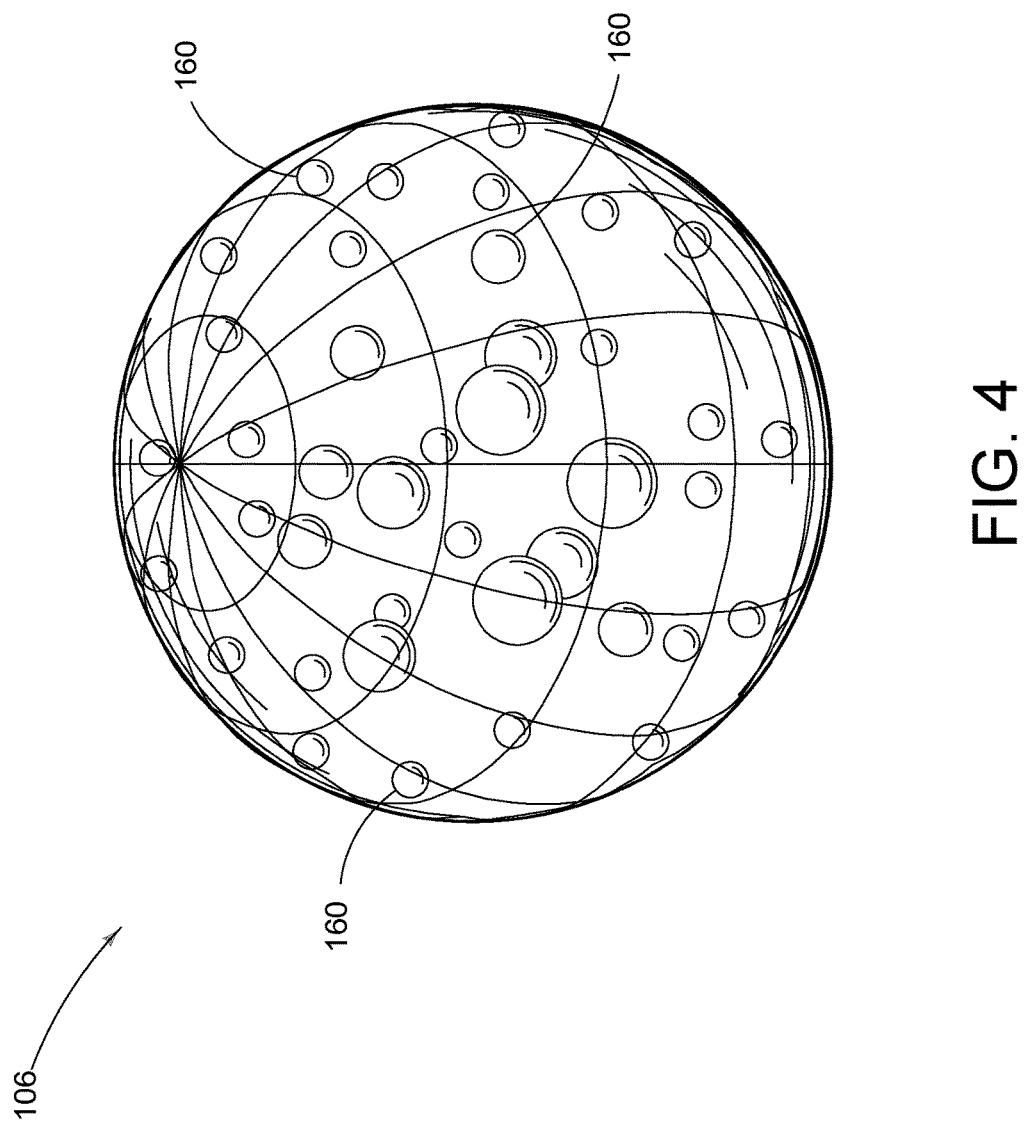
FIG. 4 shows an enlarged view of the target cell including figurative representations of free electrons according to one aspect of the present embodiments.

Referring now to FIG. 4, an enlarged view of the target cell 106 including figurative representations of free electrons 160 is shown according to one aspect of the present embodiments. As previously described, in various embodiments an excitation laser may excite electrons thereby creating free charge. For example, a laser may cause a coulomb explosion thereby exciting the free electrons 106 and creating charge mobility within the target cell 106. The same laser or a different laser may then be used (or simultaneously used) to control the free electrons 106 within the target cell 106. As a result, in some embodiments the characteristics of the target cell 106 are altered to store information electrically by redistributing the free electrons 106 to align with the incoming light's electric field (e.g. the electric field of the laser 104, see FIG. 1). As such, the light's electric field intensity is sufficiently high such that the ensemble of electron's potential energy is increased so that charge mobility in the target cell can occur.

Figure 5:
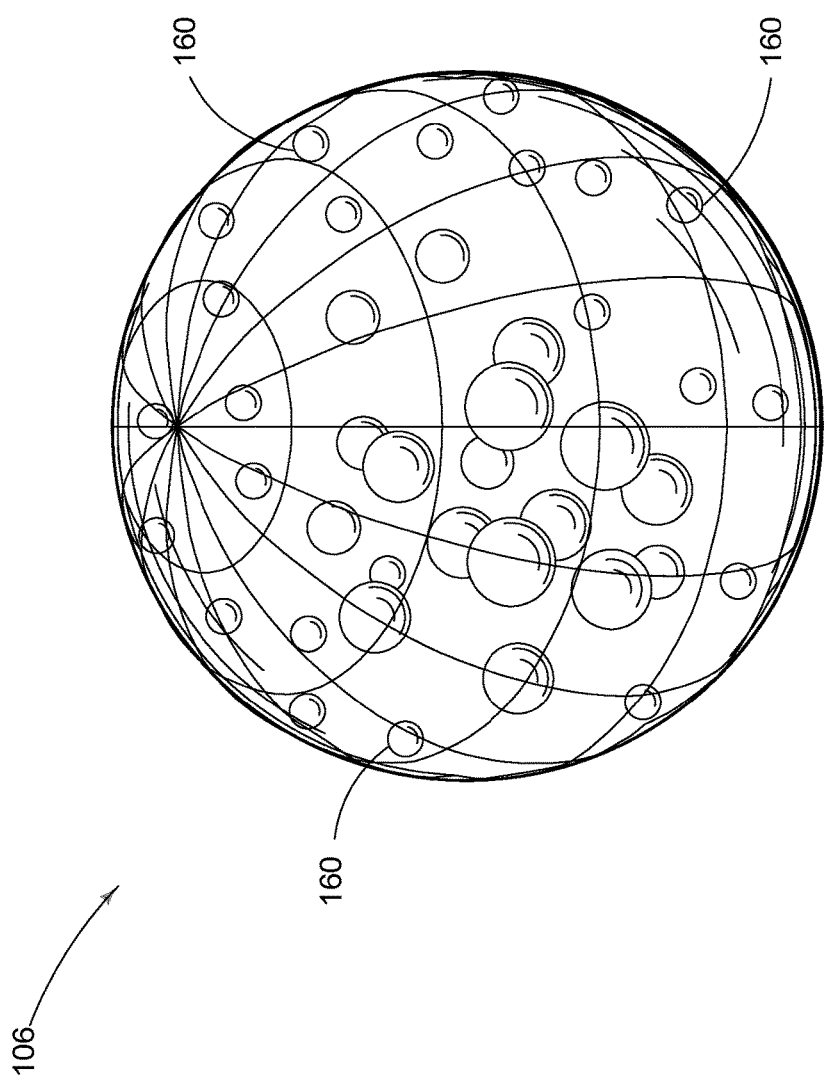
FIG. 5 shows an enlarged view of the target cell including a first increased density of free electrons according to one aspect of the present embodiments.

Referring now to FIG. 5, an enlarged view of the target cell 106 including a first increased density of free electrons 160 is shown according to one aspect of the present embodiments. In various embodiments, the excited free electrons 106 (e.g. free charge) accumulate at a location in the target cell 106 based on the electric field intensity of one or more lasers (e.g. laser 104, see FIG. 1). As a result, information can be stored by detecting the location of the accumulated electrical charge within the target cell 106. In the illustrated embodiment, the location of the increased density of the free electrons 160 may be expressed according to a spherical coordinate system. However, alternate embodiments may use target cells and coordinate systems according to any shape.

Figure 6:
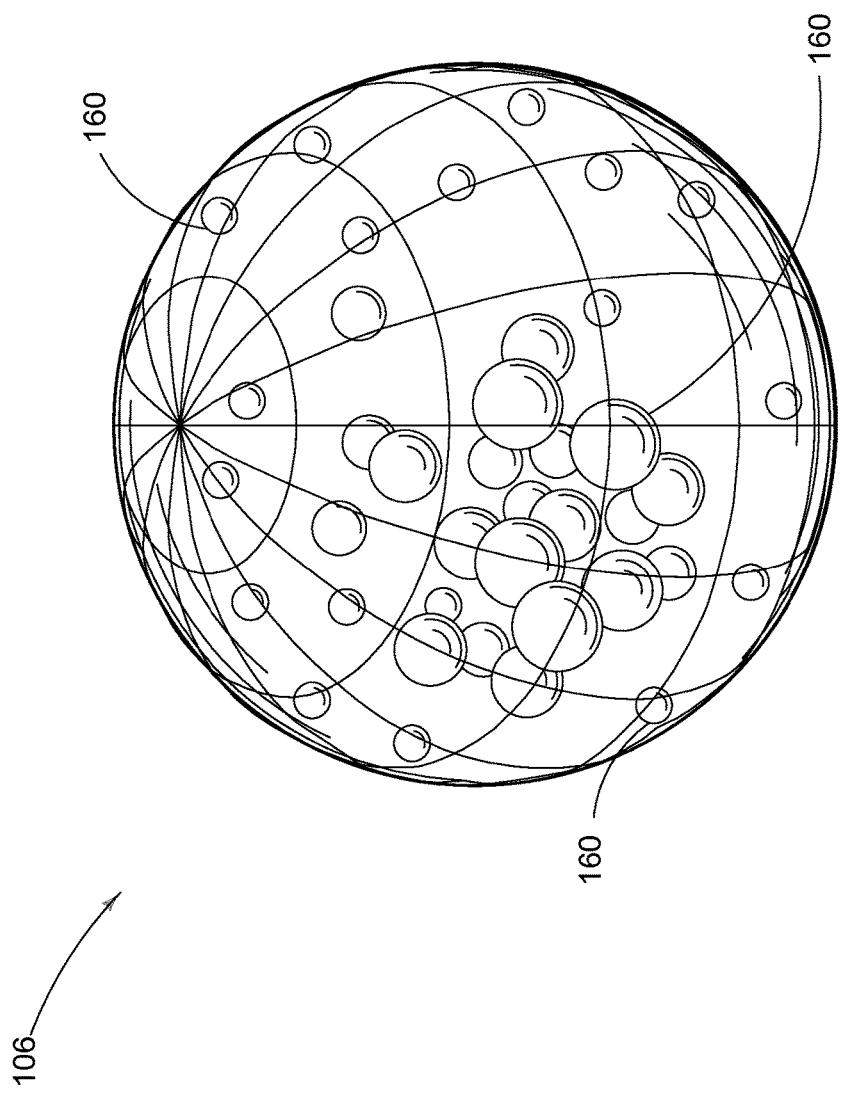
FIG. 6 shows an enlarged view of the target cell including a second increased density of free electrons according to one aspect of the present embodiments.

Referring now to FIG. 6, an enlarged view of the target cell 106 including a second increased density of free electrons 160 is shown according to one aspect of the present embodiments. In some embodiments, the density of the free electrons 160 is controlled and detectable. As such, the magnitude and intensity of the stored charge can also be used to store information along with the location of the charge. For example, the first density of free electrons illustrated in FIG. 5 will have a weaker intensity than the second increased density of free electrons 160 illustrated in FIG. 6, because the second increased density is greater than the first increased intensity. In further embodiments, different densities of the free electrons 160 may be used to create varying intensities of electrical charge, thereby allowing for the storage of different information within the target cell 106. In other embodiments, more than one density of free electrons 160 with different intensities can be stored within the target cell 106, as long as the more than one densities and intensities of the free electrons 160 are detectable enough to retrieve stored information.

Figure 7:
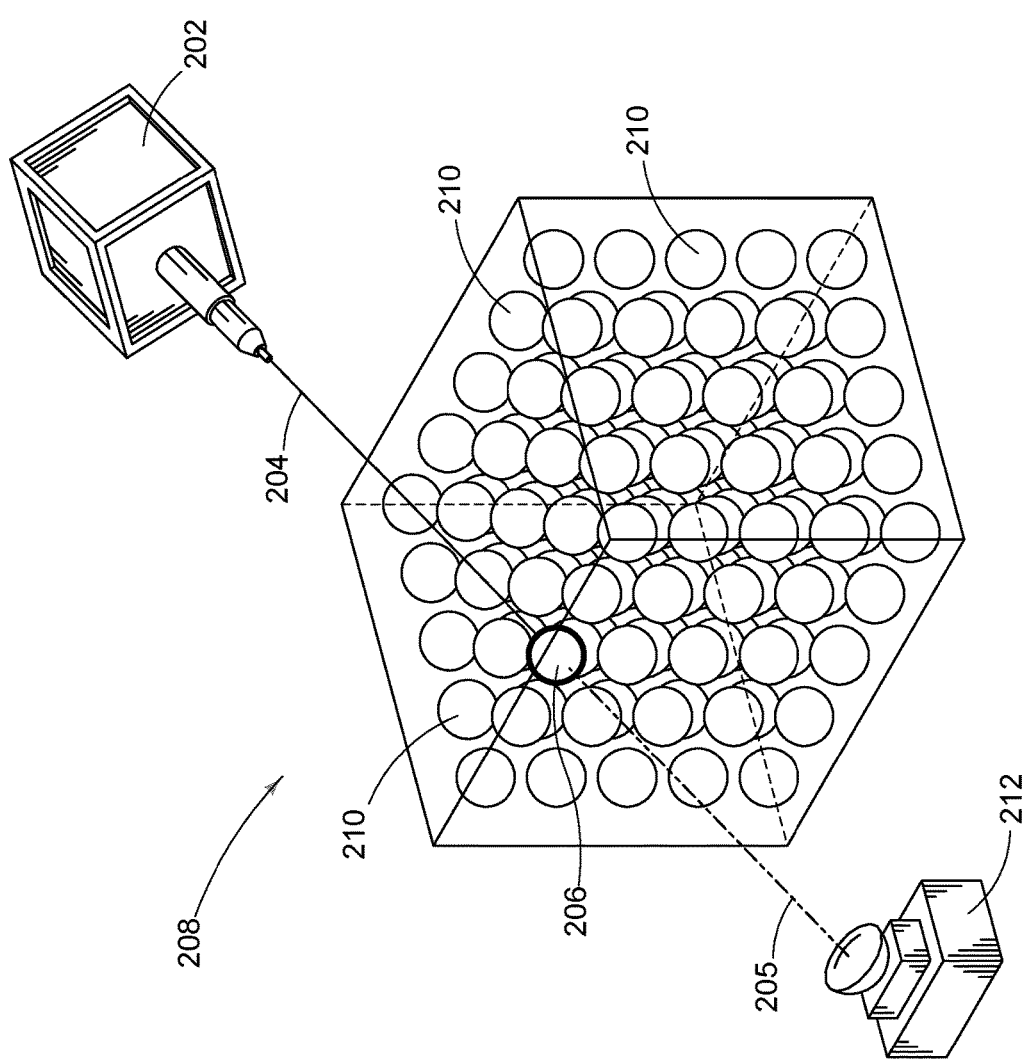
FIG. 7 shows a target cell of a three dimensional storage device altering a laser from an emitter, and a detector detecting the altered laser according to one aspect of the present embodiments.

Referring now to FIG. 7, a target cell 206 of a three dimensional storage device 208 altering a laser 204 from an emitter 202, and a detector 212 detecting the altered laser 205 is shown according to one aspect of the present embodiments. The emitter 202 generates a lower power laser 204 than the FIG. 1 laser 104. As such, the lower power laser 204 may be focused on the target cell 206, without altering the properties of the target cell 206. However, the properties of the target cell 206 may alter the laser 204, thereby transforming the laser 204 into the altered laser 205. The altered laser 205 is then detected at the detector 212. As a result, information stored by the target cell 206 may be read through the detection of the altered laser 205. It is understood that in certain configurations the target cell 206 may not alter the properties of the laser 204, and therefore the altered laser 205 may be the same as the laser 204.

For example, information may be electrically stored in one or more of the cells, as described in FIGS. 1-6. The emitter 202 may then generate the laser 204 with a first property (for example a first wavelength). The laser 204 is focused on the target cell 206, and travels through other storage cells 210, without being altered. The target cell 206 then changes the first property of the laser 204 into a second property (for example a second wavelength) thereby transforming the laser 204 into an altered laser 205. The altered laser 205 is then received at the detector 212, which interprets the altered laser 205 as the information stored earlier in the target cell 206. In various embodiments, one or more of the other storage cells 210 may also alter the laser 204, thereby contributing to the alterations of the altered laser 205 that is detected at the detector 212.

In some embodiments, the information detected at the detector 212 may include different complexities of information based on the properties of the target cell 206. For example as described in earlier figures, the properties of the target cell 206 may include electrical information including charge location and intensity within the target cell 206. Such information about the amount of charge accumulated can be determined by measuring the dot product and noting the intensity, in some embodiments. Additional methods of reading the electrical properties of the target cell 206 may include using a lower power/lower intensity laser that sweeps the polarization vector from 0 to Pi radians. Such examples and methods are understood to be non-limiting, and alternate embodiments may use other methods for reading the electrical information stored in the target cell 206. As a result, information beyond binary states can be recorded within the three dimensional storage device 208.

It is understood that FIGS. 1 through 7 work in conjunction with each other, and that for clarity of illustration certain elements of FIGS. 1 through 7 are not pictured in all of the figures (e.g. the detector 212). In various embodiments, the emitter 102 and the emitter 202 may be the same emitter or different emitters. For example, a single emitter may be used to emit the higher power laser used in the write functions described with respect to FIG. 1. The same single emitter may also be used to emit the lower power laser used in the read functions described with respect to FIG. 2. In further embodiments, the emitter 102 used to write information may be separate from the emitter 202 used to read information.

Figure 8:
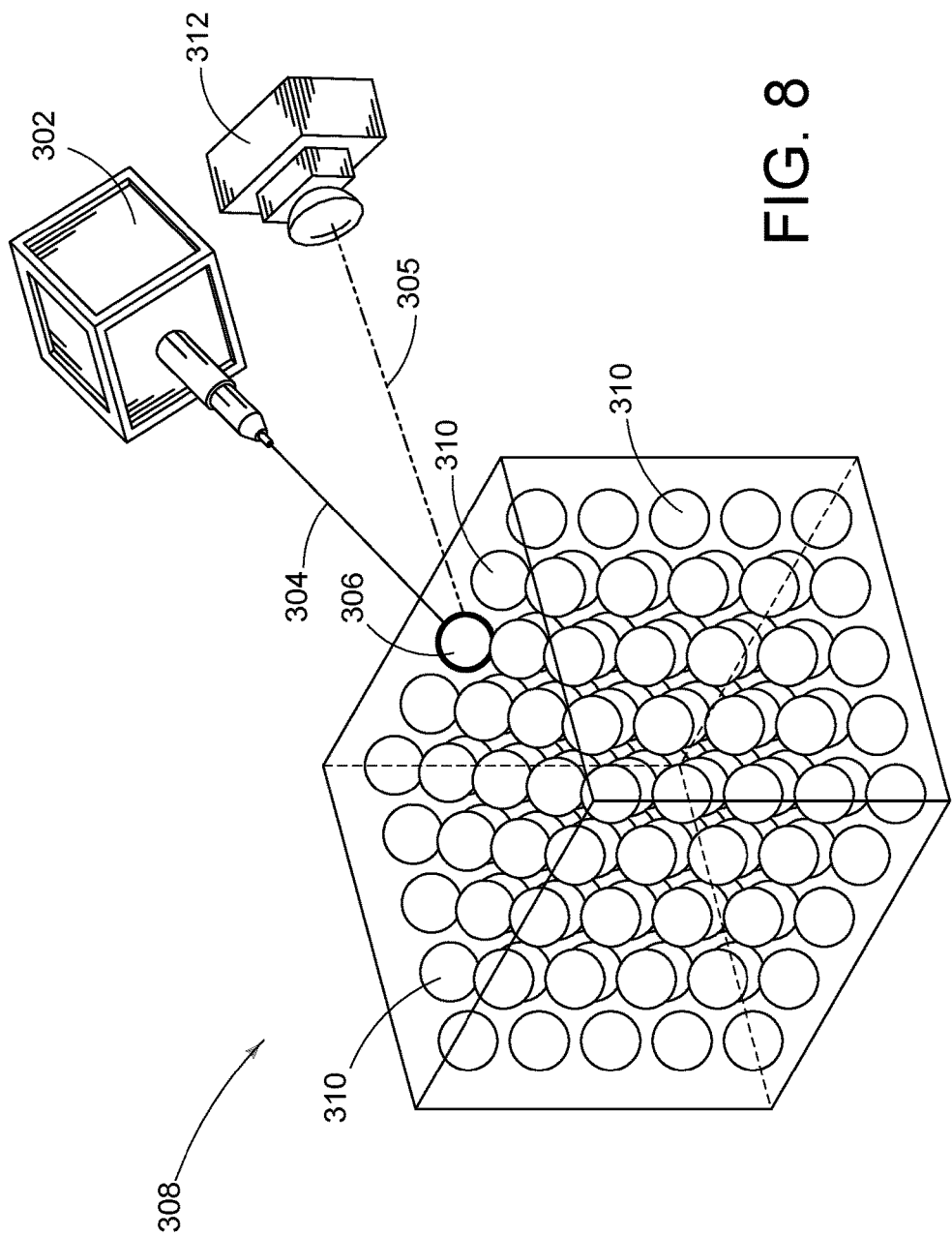
FIG. 8 shows a target cell of a three dimensional storage device reflecting and altering a laser from an emitter, and a detector detecting the altered laser according to one aspect of the present embodiments.

Referring now to FIG. 8, a target cell 306 of a three dimensional storage device 308 reflecting and altering a laser 304 from an emitter 302, and a detector 312 detecting the altered laser 305 is shown according to one aspect of the present embodiments. Similar to FIG. 7, in the embodiment of FIG. 8 the emitter 302 generates a lower power laser 304 than the FIG. 1 laser 104. As such, the lower power laser 304 may be focused on a target cell 306, without altering the properties of the target cell 306.

However, the properties of the target cell 306 may alter and reflect the laser 304 (or a portion of the laser 304), thereby transforming the laser 304 into the altered laser 305. Therefore, the target cell 306 of FIG. 8 differs from the target cell 206 of FIG. 7 by reflecting the laser 305. As a result, the altered laser 305 is a reflected laser that is then detected at the detector 312. Information stored by the target cell 306 may be read through the detection of the altered laser 305. It is understood that in certain configurations the target cell 306 may not alter the properties of the laser 304, and therefore the altered laser 305 may be the same as the laser 304.

For example, information may be stored in one or more of the cells, as described in FIG. 1. The emitter 302 may then generate a laser 304 with a first property (for example a first intensity). The laser 304 is focused on the target cell 306, and travels through other storage cells 310, without being altered. The target cell 306 then changes the first property of the laser 304 into a second property (for example a second intensity) thereby transforming the laser 304 into an altered laser 305. The altered laser 305 is then reflected from the target cell 306 and received at the detector 312. The detector 312 interprets the altered laser 305 as the information stored earlier in the target cell 306. In various embodiments, one or more of the other storage cells 310 may also alter the laser 304, thereby contributing to the alterations of the altered laser 305 that is detected at the detector 312.

It is understood that FIG. 1 and FIG. 8 work in conjunction with each other, and that for clarity of illustration certain elements of FIG. 1 and FIG. 8 are not pictured in both figures (e.g. the detector 312). In various embodiments, the emitter 102 and the emitter 302 may be the same emitter or different emitters. For example, a single emitter may be used to emit the higher power laser used in the write functions described with respect to FIG. 1. The same single emitter may also be used to emit the lower power laser used in the read functions described with respect to FIG. 8. In further embodiments, the emitter 102 used to write information may be separate from the emitter 302 used to read information.

Figure 9:
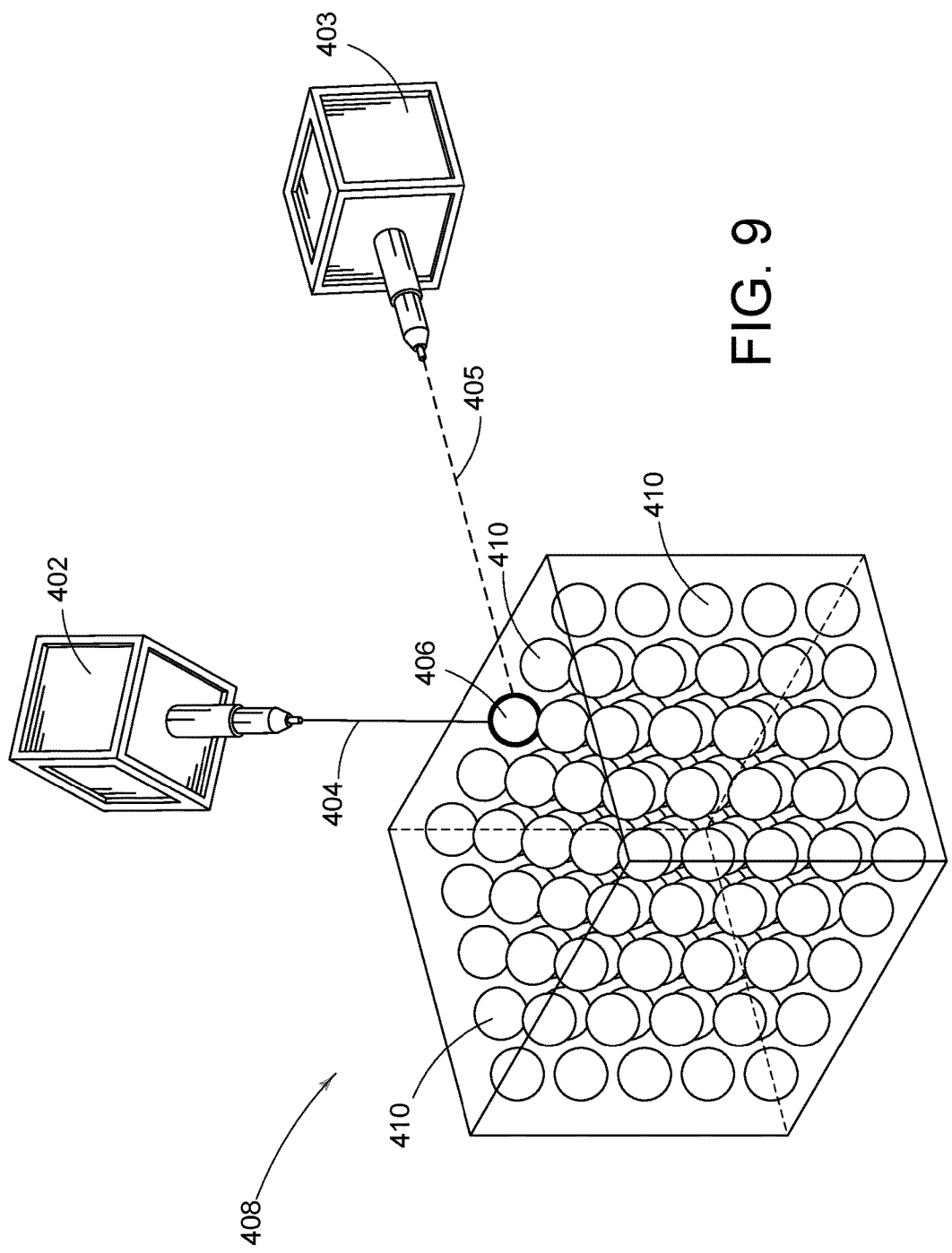
FIG. 9 shows a first emitter and a second emitter focusing a first laser and a second laser on a cell of a three dimensional storage device according to one aspect of the present embodiments.

Referring now to FIG. 9, a first emitter 402 and a second emitter 403 focusing a first laser 404 and a second laser 405 on a cell 406 of a three dimensional storage device 408 are shown according to one aspect of the present embodiments. As in FIG. 1, the first emitter 402 creates a high power first laser 404, and the second emitter 403 creates a low power second laser 405. It is understood that high power and low power are relative to each other. Therefore, the first laser 404 has a higher power than the second laser 405, and the second laser 405 has a lower power than the first laser 404.

The first laser 404 is focused on the target cell 406. The target cell 406 is one of many storage cells 410 arranged within a three dimensional array within the three dimensional storage device 408. When the laser 404 is focused on the target cell 406, the electrical properties of the target cell 406 may be altered (as previously described), thereby storing information.

In addition, the second emitter 403 may be focused on the target cell 406. In various embodiments, the second emitter 403 may create a lower power second laser 405 or a higher power second laser 405. Therefore, the second emitter 403 may be used in conjunction with the first emitter 402 for writing information to the target cell 406. In addition, the second emitter 403 may be used to read information from the target cell 406 before, during, and/or after the first emitter creates the first laser 404. For clarity of illustration, the detector (see FIG. 8) is not shown, however it is understood that one or more detectors may be present in various embodiments.

In further embodiments, different intensities of the first laser 404 (from the first emitter 402) and the second laser 405 (from the second emitter 403) may be combined for reading and/or writing to the target cell 406. For example, the first laser 404 alone and the second laser 405 alone may not have sufficient power to write to the target cell 406. However, the combination of the first laser 404 and the second laser 405 may have sufficient power to write to the target cell 406. Therefore, it is understood that various combinations of laser intensities may be used to read cell electrical properties or change cell electrical properties.

Figure 10:
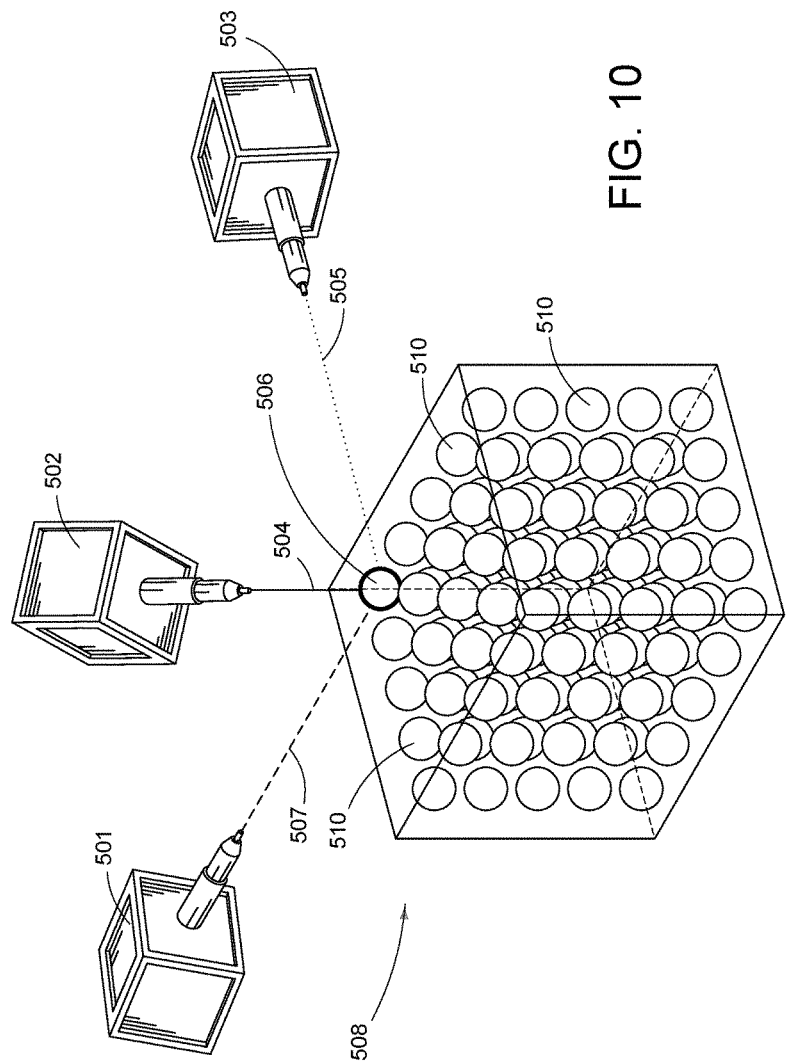
FIG. 10 shows a first emitter, a second emitter, and a third emitter focusing a first laser, a second laser, and a third laser on a cell of a three dimensional storage device according to one aspect of the present embodiments.

Referring now to FIG. 10, a first emitter 502, a second emitter 503, and a third emitter 501 focusing a first laser 504, a second laser 505, and a third laser 507 on a cell 506 of a three dimensional storage device 508 are shown according to one aspect of the present embodiments. As in FIG. 1, the first emitter 502 creates a higher power first laser 504. The first laser 504 is focused on the target cell 506. The target cell 506 is one of many storage cells 510 arranged within a three dimensional array within the three dimensional storage device 508. When the laser 504 is focused on the target cell 506, the electrical properties of the target cell 506 may be altered (as previously described), thereby storing information.

In addition, the second emitter 503 and the third emitter 501 may be focused on the target cell 506. In various embodiments, the second emitter 503 creates a lower power second laser 505 or a higher power second laser 505, and the third emitter 501 creates a lower power third laser 507 or a higher power third laser 507. It is understood that any combination of differently powered lasers may be used. For example, a high power laser, a medium power laser, and a low power laser may be used by any of the three emitters. In a further example, a high power laser and two low power lasers may be used by any of the three emitters. In still further examples, different power combinations may be produced by any of the emitters.

Therefore for example, the second emitter 503 and/or the third emitter 501 may be used in conjunction with the first emitter 502 for writing information to the target cell 506. In addition, the second emitter 503 and/or the third emitter 501 may be used to read information from the target cell 506 before, during, and/or after the first emitter creates the first laser 504. For clarity of illustration, the detector (see FIG. 8) is not shown, however it is understood that one or more detectors may be present in various embodiments.

In further embodiments, different intensities of the first laser 504 from the first emitter 502, the second laser 505 from the second emitter 503, and/or the third laser 507 from the third emitter 501 may be combined for reading and/or writing to the target cell 506. For example, the first laser 504 alone, the second laser 505 alone, and/or the third laser 507 alone may not have sufficient power to write to the target cell 506. However, the combination of the first laser 504, the second laser 505, and/or the third laser 507 may have sufficient power to write to the target cell 506. In a still further example, different lasers or combinations of lasers may change and/or read different properties (e.g. reflectivity, transparency, refractivity, etc.) of the cell. The different properties may be changed or read simultaneously or at different times. Therefore, it is understood that various combinations of laser intensities may be used to read cell properties or change cell properties.

Figure 11:
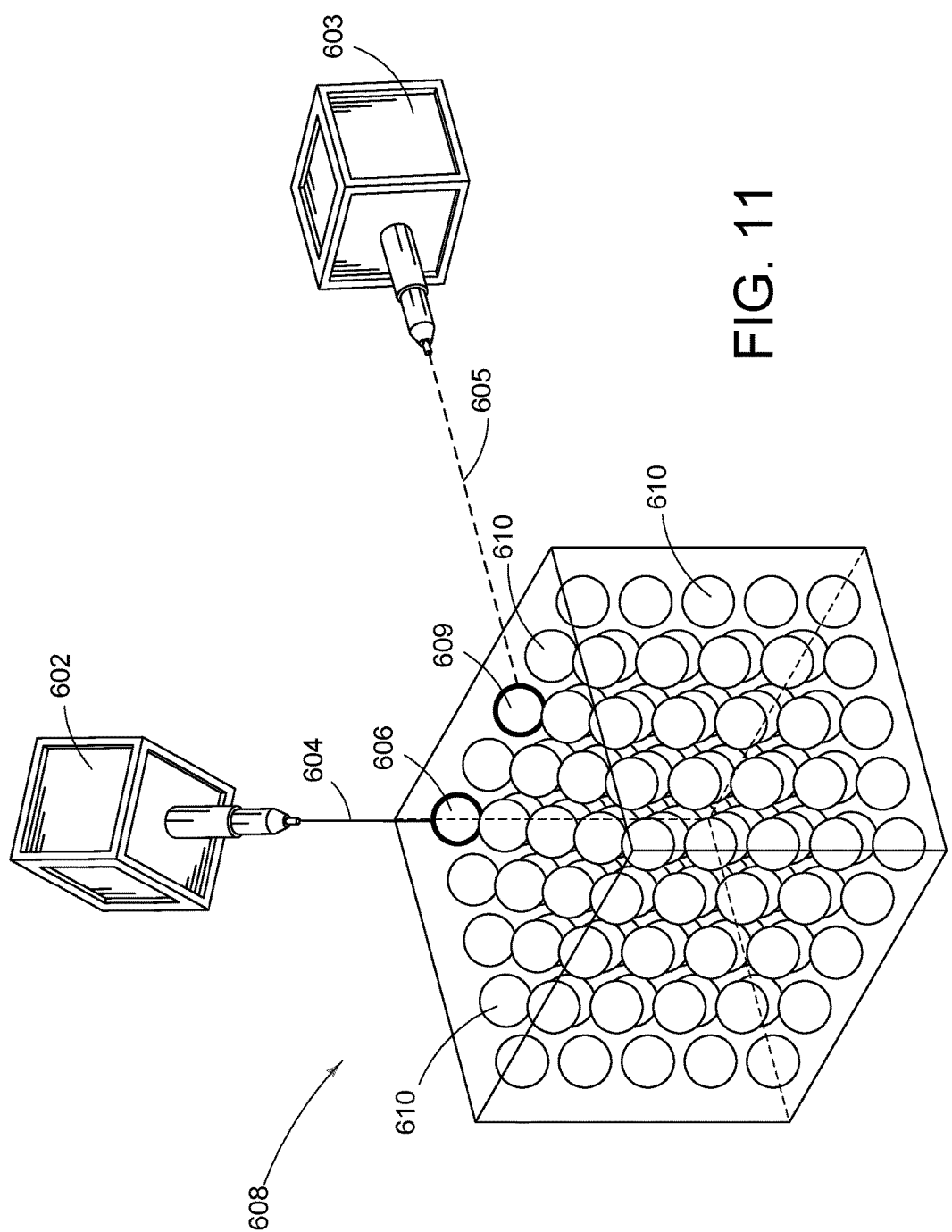
FIG. 11 shows a first emitter focusing a first laser on a first cell, and a second emitter focusing a second laser on a second cell of a three dimensional storage device according to one aspect of the present embodiments.

Referring now to FIG. 11, a first emitter 602 focusing a first laser 604 on a first cell 606, and a second emitter 603 focusing a second laser 605 on a second cell 609 of a three dimensional storage device 608 are shown according to one aspect of the present embodiments. As in previous figures, the first emitter 602 may perform read/write operations on the first target cell 606 by radiating a higher power or lower power first laser 604. The first laser 604 is focused on the first target cell 606. The first target cell 606 is one of many storage cells 610 arranged within a three dimensional array within the three dimensional storage device 608. When the laser 604 is focused on the target cell 606, properties of the target cell 606 may be altered or read (as previously described). It is understood that the first emitter 602 may perform the read/write functions by itself or in conjunction with one or more additional emitters.

In addition, the second emitter 603 may be focused on the second target cell 609. The second emitter 603 may perform read/write operations on the second target cell 609 by radiating a higher power or lower power second laser 605. The second laser 605 is focused on the second target cell 609. The second target cell 609 is one of many storage cells 610 arranged within the three dimensional array within the three dimensional storage device 608. When the second laser 605 is focused on the second target cell 609, properties of the second target cell 609 may be altered or read (as previously described). It is understood that the second emitter 603 may perform the read/write functions by itself or in conjunction with one or more additional emitters.

In various embodiments, the first emitter 602 and the second emitter 603 may perform read functions or write functions at the same time or at different times. In some embodiments, different read functions and different writing functions may be performed simultaneously by the first emitter 602 and the second emitter 603. For example, the first emitter 602 may be detecting or creating a first electron density of the first target cell 606, and the second emitter 603 may be detecting or creating a second electron density of the second target cell 609 that is different from the first electron density. For clarity of illustration, one or more detectors (see FIG. 8) are not shown, however it is understood that one or more detectors may be present in numerous combinations with the emitters in various embodiments.

Therefore, as described above, embodiments may include a first storage cell including an electrical property. The first storage cell is configured to change the electrical property in response to a first light energy and to maintain the change to the electrical property. The first storage cell is also configured to alter the change to the electrical property in response to a second light energy and to maintain the alteration to the change to the electrical property. A second storage cell is disposed over the first storage cell in a vertical plane of the first storage cell. A third storage cell is disposed adjacent to the first storage cell in a horizontal plane of the first storage cell.

In some embodiments, the electrical property is configured to change a property of a third light energy that is less than the first light energy. In addition, the electrical property is configured to remain the same in response to the third light energy.

In various embodiments, the electrical property is a dipole orientation of the first storage cell. In some embodiments, a detector is configured to detect a dipole orientation of the first storage cell. The detector may be further configured to detect a magnitude of the dipole orientation of the first storage cell.

In further embodiments, the electrical property is a concentration of free charge at a location within the first storage cell. A detector may be configured to detect the concentration of free charge at the location within the first storage cell. In addition, the detector may be further configured to detect a magnitude of the concentration of free charge at the location within the first storage cell.

Other embodiments may include a three dimensional crystalline structure with a number of storage locations, wherein the storage locations are arranged in three dimensions within the crystalline structure. A light source is configured to focus a first light with a first energy on a storage location of the number of storage locations. The focused first light is operable to alter an electrical orientation of the storage location. The light source is further operable to focus a second light with a second light energy on the storage location without altering the electrical orientation. A detector is operable to detect the second light energy.

In some embodiments, the focused first light is further operable to alter a magnitude of the electrical orientation of the storage location. The light source may be further operable to alter the electrical orientation without heating the three dimensional crystalline structure. In addition, the light source may be a femtosecond laser. In various embodiments, the storage location is operable to remain transparent while maintaining the electrical orientation or the alteration to the electrical orientation.

Other embodiments may include a first location configured to change a first electrical alignment in response to a first energy. A second location over the first location in a z-axis is configured to change a second electrical alignment in response to the first energy. A third location adjacent to the first location in an x-axis is configured to change a third electrical alignment in response to the first energy. A detector is configured to detect a second energy from the first location, the second location, or the third location, wherein the first electrical alignment, the second electrical alignment, and the third electrical alignment are configured to remain unchanged in response to the second energy.

In some embodiments, an energy source is configured to individually focus the first energy on the first location, the second location, or the third location. The energy source may be configured to emit the first energy and the second energy. The energy source may be further configured to change the first electrical alignment, the second electrical alignment, or the third electrical alignment without heating the first location, the second location, or the third location.

In further embodiments, the first electrical alignment includes an electrical magnitude. In some embodiments, energy source is configured to create a coulomb explosion in the first location. In various embodiments, the first location, the second location, and the third location are configured to remain transparent while maintaining the change to their respective electrical alignments.

While the embodiments have been described and/or illustrated by means of particular examples, and while these embodiments and/or examples have been described in considerable detail, it is not the intention of the Applicants to restrict or in any way limit the scope of the embodiments to such detail. Additional adaptations and/or modifications of the embodiments may readily appear, and, in its broader aspects, the embodiments may encompass these adaptations and/or modifications. Accordingly, departures may be made from the foregoing embodiments and/or examples without departing from the scope of the concepts described herein. The implementations described above and other implementations are within the scope of the following claims.

What is claimed is:

1. An apparatus comprising:
a first storage cell including an electrical property, wherein
the electrical property is a concentration of free charge at a location within the first storage cell,
the first storage cell changes the electrical property in response to a first light energy,
the first storage cell maintains the change to the electrical property,
the first storage cell alters the change to the electrical property in response to a second light energy, and
the first storage cell maintains the alteration to the change to the electrical property;
a second storage cell disposed over the first storage cell in a vertical plane of the first storage cell; and
a third storage cell disposed adjacent to the first storage cell in a horizontal plane of the first storage cell.

2. The apparatus of claim 1, wherein
the electrical property changes a property of a third light energy,
the third light energy is less than the first light energy, and
the electrical property remains the same in response to the third light energy.

3. The apparatus of claim 1, wherein the electrical property is a dipole orientation of the first storage cell.

4. The apparatus of claim 1, further comprising a detector configured to detect a dipole orientation of the first storage cell.

5. The apparatus of claim 4, wherein the detector is further configured to detect a magnitude of the dipole orientation of the first storage cell.

6. The apparatus of claim 1, further comprising a detector configured to detect the concentration of free charge at the location within the first storage cell.

7. The apparatus of claim 6, wherein the detector is further configured to detect a magnitude of the concentration of free charge at the location within the first storage cell.

8. An apparatus comprising:
a three dimensional crystalline structure including a plurality of storage locations, wherein the plurality of storage locations is arranged in three dimensions within the crystalline structure;
a light source focusing a first light with a first energy on a storage location of the plurality of storage locations, wherein
the focused first light alters an electrical orientation of the storage location, and
the light source focuses a second light with a second light energy on the storage location without altering the electrical orientation; and
a detector operable to detect the second light energy, wherein the detector is further operable to detect a concentration of free charge at the storage location.

9. The apparatus of claim 8, wherein the first light passes through a subset of the plurality of storage locations without altering the subset of the plurality of storage locations.

10. The apparatus of claim 8, wherein the focused first light alters a magnitude of the electrical orientation of the storage location.

11. The apparatus of claim 8, wherein the light source alters the electrical orientation without heating the three dimensional crystalline structure.

12. The apparatus of claim 8, wherein the light source is a femtosecond laser.

13. The apparatus of claim 8, wherein the storage location remains transparent to the first light while maintaining the electrical orientation or the alteration to the electrical orientation.

14. An apparatus comprising:
a first location configured to change a first electrical alignment in response to a first energy;
a second location over the first location in a z-axis configured to change a second electrical alignment in response to the first energy;
a third location adjacent to the first location in an x-axis configured to change a third electrical alignment in response to the first energy;
an energy source configured to create a coulomb explosion in the first location; and
a detector configured to detect a second energy from the first location, the second location, or the third location, wherein the first electrical alignment, the second electrical alignment, and the third electrical alignment remain unchanged in response to the second energy.

15. The apparatus of claim 14, further comprising an energy source configured to individually focus the first energy on the first location, the second location, or the third location.

16. The apparatus of claim 14, further comprising an energy source, wherein
the energy source is configured to emit the first energy and the second energy, and
the energy source is configured to change the first electrical alignment, the second electrical alignment, or the third electrical alignment without heating the first location, the second location, or the third location.

17. The apparatus of claim 14, wherein the first electrical alignment includes an electrical magnitude.

18. The apparatus of claim 14, wherein the first location, the second location, and the third location remain transparent to the first energy while maintaining the change to their respective electrical alignments.

\* \* \* \* \*